United States Patent
Watanabe et al.

(10) Patent No.: US 10,090,459 B2
(45) Date of Patent: Oct. 2, 2018

(54) MAGNETORESISTIVE ELEMENT

(71) Applicant: Toshiba Memory Corporation, Minato-ku, Tokyo (JP)

(72) Inventors: Daisuke Watanabe, Kai (JP); Youngmin Eeh, Kawagoe (JP); Kazuya Sawada, Morioka (JP); Koji Ueda, Fukuoka (JP); Toshihiko Nagase, Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/397,594

(22) Filed: Jan. 3, 2017

(65) Prior Publication Data
US 2017/0117459 A1  Apr. 27, 2017

Related U.S. Application Data

(62) Division of application No. 13/963,734, filed on Aug. 9, 2013, now abandoned.

(60) Provisional application No. 61/804,467, filed on Mar. 22, 2013.

(51) Int. Cl.
| | | |
|---|---|---|
| H01L 29/82 | (2006.01) | |
| H01L 43/10 | (2006.01) | |
| H01F 1/03 | (2006.01) | |
| H01F 10/32 | (2006.01) | |
| H01L 43/08 | (2006.01) | |
| H01L 43/12 | (2006.01) | |
| H01L 27/22 | (2006.01) | |

(52) U.S. Cl.
CPC ........... H01L 43/10 (2013.01); H01F 1/0306 (2013.01); H01F 10/3286 (2013.01); H01L 27/228 (2013.01); H01L 43/08 (2013.01); H01L 43/12 (2013.01)

(58) Field of Classification Search
CPC combination set(s) only.
See application file for complete search history.

(56) References Cited

U.S. PATENT DOCUMENTS

| | | |
|---|---|---|
| 5,432,734 A | 7/1995 | Kawano et al. |
| 6,633,465 B2 | 10/2003 | Hoshiya et al. |
| 7,704,613 B2 | 4/2010 | Suzuki et al. |
| 8,107,281 B2 | 1/2012 | Kai et al. |
| 8,139,405 B2 | 3/2012 | Yoshikawa et al. |
| 8,299,552 B2 | 10/2012 | Nagase et al. |
| 8,520,433 B1 | 8/2013 | Kato et al. |
| 8,553,450 B2 | 10/2013 | Hosotani et al. |
| 8,665,639 B2 | 3/2014 | Nagase et al. |
| 8,669,628 B2 | 3/2014 | Ueda et al. |
| 8,670,268 B2 | 3/2014 | Nagase et al. |
| 8,680,632 B2 | 3/2014 | Daibou et al. |

(Continued)

Primary Examiner — Telly Green
(74) Attorney, Agent, or Firm — Holtz, Holtz & Volek PC

(57) ABSTRACT

A magnetoresistive element includes a storage layer as a ferromagnetic layer which has magnetic anisotropy perpendicular to film planes, and in which a magnetization direction is variable, a reference layer as a ferromagnetic layer which has magnetic anisotropy perpendicular to film planes, and in which a magnetization direction is invariable, a tunnel barrier layer as a nonmagnetic layer formed between the storage layer and the reference layer, and a first underlayer formed on a side of the storage layer, which is opposite to a side facing the tunnel barrier layer, and containing amorphous W.

20 Claims, 10 Drawing Sheets

(56) References Cited

U.S. PATENT DOCUMENTS

| | | |
|---|---|---|
| 8,680,633 B1 | 3/2014 | Kato et al. |
| 8,705,269 B2 | 4/2014 | Nagase et al. |
| 8,750,029 B2 | 6/2014 | Kitagawa et al. |
| 8,750,030 B2 | 6/2014 | Ueda et al. |
| 2001/0033465 A1* | 10/2001 | Noma .................... B82Y 10/00 360/324.12 |
| 2002/0008946 A1* | 1/2002 | Noma .................... B82Y 10/00 360/324.11 |
| 2005/0254179 A1 | 11/2005 | Miyauchi et al. |
| 2005/0275975 A1* | 12/2005 | Zhang .................... B82Y 10/00 360/324.12 |
| 2007/0053113 A1 | 3/2007 | Papworth et al. |
| 2007/0139987 A1 | 6/2007 | Kouchiyama et al. |
| 2008/0088980 A1 | 4/2008 | Kitagawa et al. |
| 2012/0068284 A1 | 3/2012 | Kitagawa et al. |
| 2012/0069642 A1 | 3/2012 | Ueda et al. |
| 2012/0088125 A1 | 4/2012 | Nishiyama et al. |
| 2012/0094453 A1 | 4/2012 | Han et al. |
| 2012/0099369 A1 | 4/2012 | Kai et al. |
| 2013/0037862 A1 | 2/2013 | Kitagawa et al. |
| 2013/0069182 A1 | 3/2013 | Ohsawa et al. |
| 2013/0175644 A1 | 7/2013 | Horng et al. |
| 2013/0187248 A1 | 7/2013 | Kariyada et al. |
| 2013/0240964 A1 | 9/2013 | Ozeki et al. |
| 2013/0250669 A1 | 9/2013 | Shukh |
| 2013/0288397 A1 | 10/2013 | Kitagawa et al. |
| 2013/0299929 A1 | 11/2013 | Watanabe et al. |
| 2014/0103469 A1 | 4/2014 | Jan et al. |

* cited by examiner

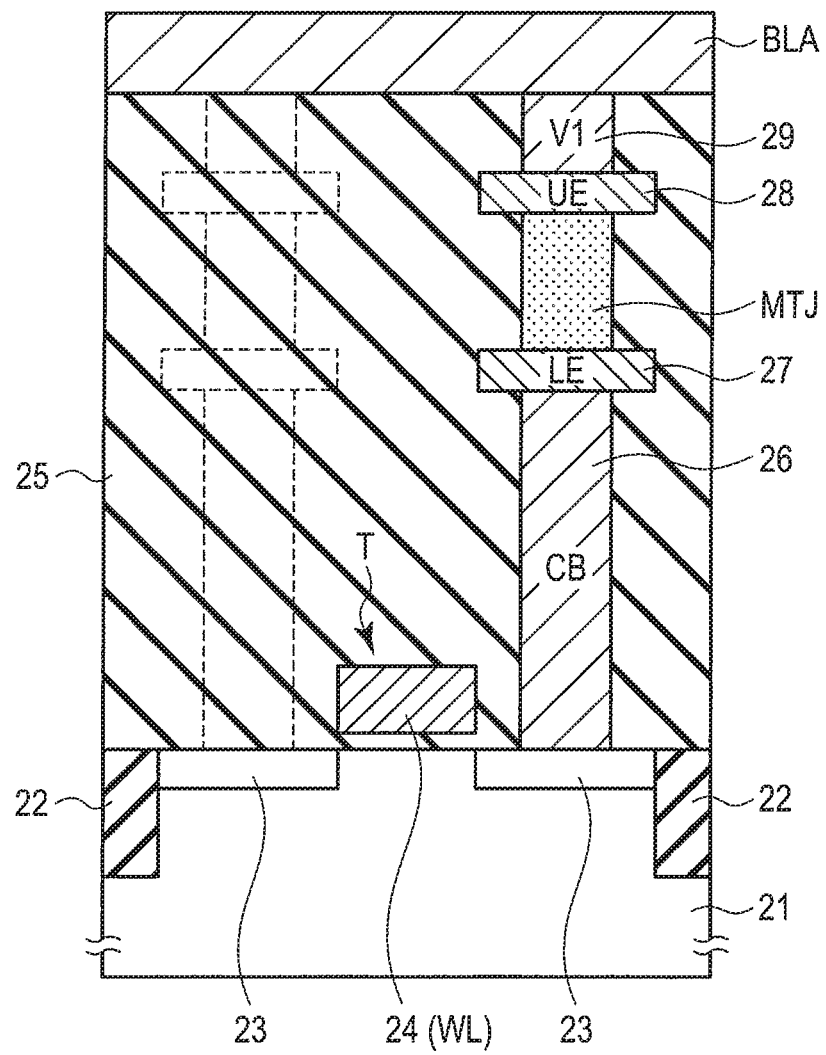
F I G. 2

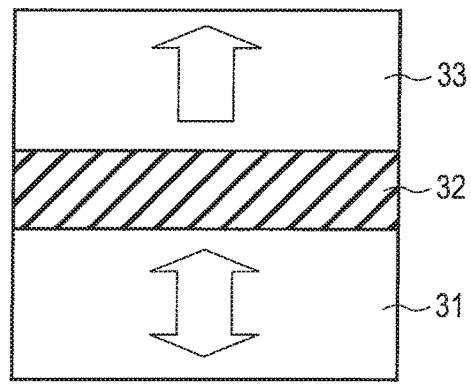
F I G. 3A
F I G. 3B  Parallel State (Low Resistance)
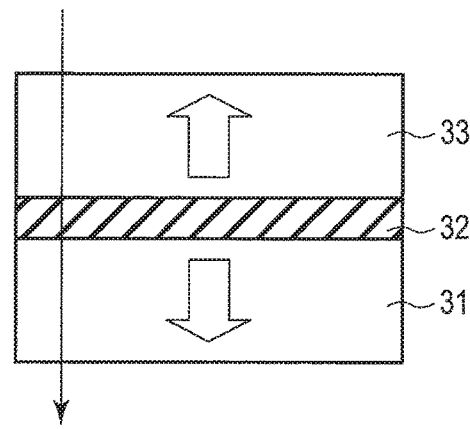
F I G. 3C  Antiparallel State (High Resistance)

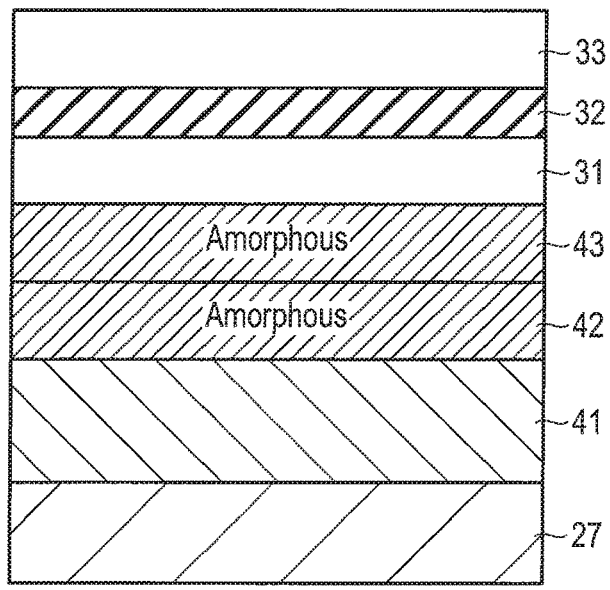
F I G. 8
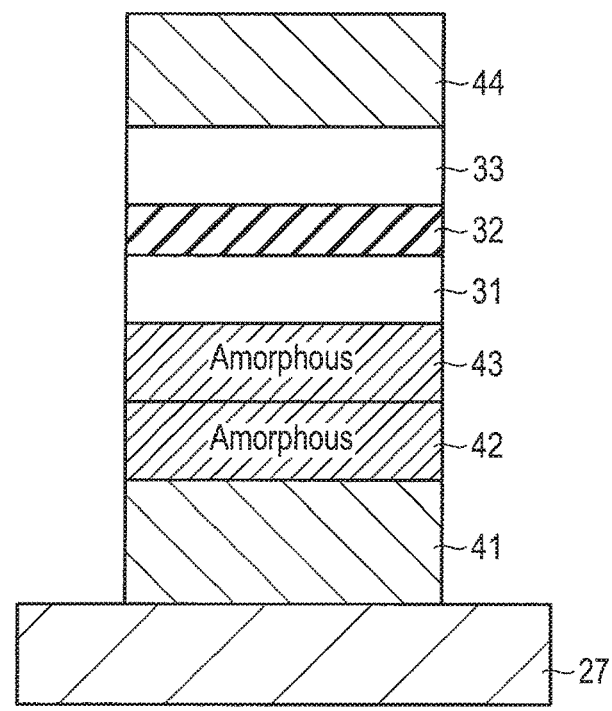
F I G. 9

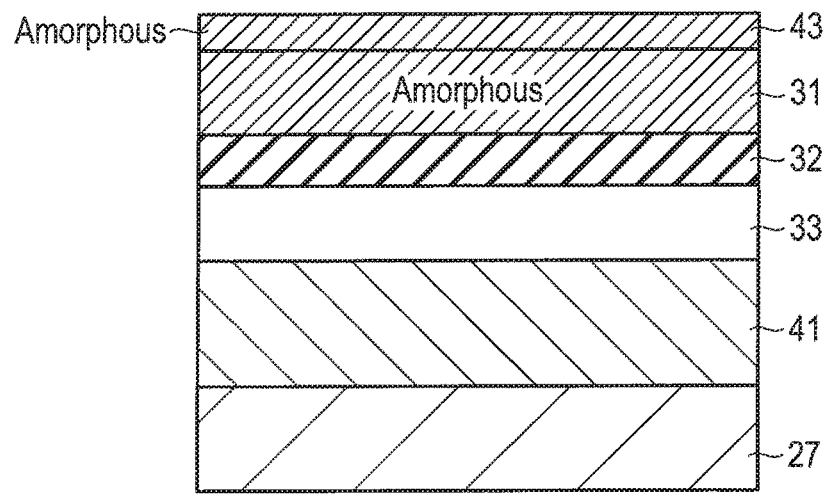
F I G. 16
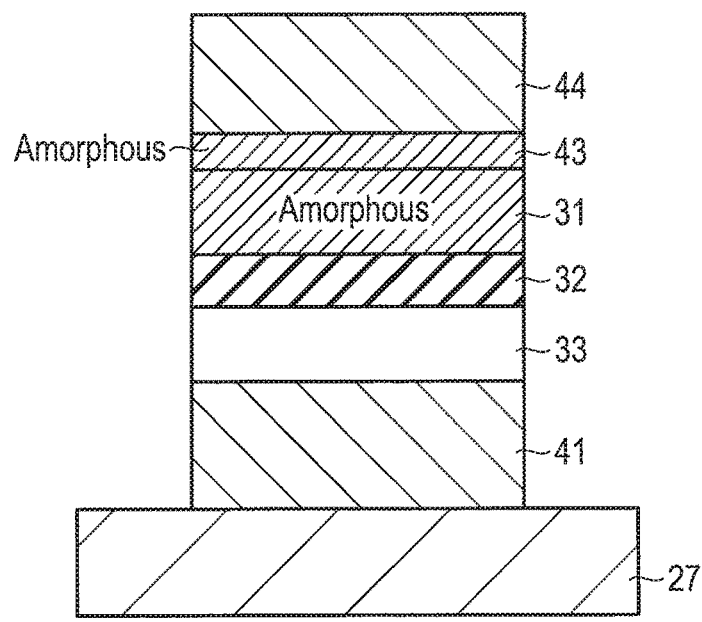
F I G. 17

MAGNETORESISTIVE ELEMENT

CROSS-REFERENCE TO RELATED APPLICATIONS

This application is a Divisional application of U.S. application Ser. No. 13/963,734, filed Aug. 9, 2013, which claims the benefit of U.S. Provisional Application No. 61/804,467, filed Mar. 22, 2013, the entire contents of both of which are incorporated herein by reference.

FIELD

Embodiments described herein relate generally to a magnetoresistive element.

BACKGROUND

A spin-transfer torque MRAM (Magnetic Random Access Memory) including a magnetoresistive element containing a ferromagnetic material as a memory element has been proposed. This MRAM is a memory that stores information by controlling the electrical resistance of the magnetoresistive element in two states, i.e., a high-resistance state/low-resistance state by changing the magnetization direction in a magnetic layer by a current to be injected into the magnetoresistive element.

The magnetoresistive element includes a storage layer as a ferromagnetic layer having a variable magnetization direction, a reference layer as a ferromagnetic layer having an invariable magnetization direction, and a tunnel barrier layer as a nonmagnetic layer formed between them.

A structure in which a perpendicular magnetization film having magnetic anisotropy perpendicular to the film planes is used as each of the storage layer and reference layer of the magnetoresistive element as described above has been proposed. When using the perpendicular magnetization film as the magnetoresistive element, no shape anisotropy is used, so the element shape can be made smaller than that when using an in-plane magnetization film. It is also possible to decrease the dispersion of the easy direction of magnetization in the perpendicular magnetization type magnetoresistive element. When adopting a material having a high magneto crystalline anisotropy, therefore, the perpendicular magnetization type magnetoresistive element is expected to achieve both micropatterning and a low current while maintaining a thermal disturbance resistance.

In the abovementioned perpendicular magnetization type magnetoresistive element, the storage layer and reference layer have different film structures. Also, the perpendicular magnetic anisotropy of the storage layer is lower than that of the reference layer. As the micropatterning of the magnetoresistive element advances, therefore, it is desirable to increase the perpendicular magnetic anisotropy of particularly the storage layer.

BRIEF DESCRIPTION OF THE DRAWINGS

FIG. 2 is a sectional view showing the structure of the memory cell of the MRAM;

FIG. 3A is a sectional view showing the structure of a magnetoresistive element;

FIG. 3B is a view for explaining a write operation of the magnetoresistive element, and is a sectional view of the magnetoresistive element in a parallel state;

FIG. 3C is a view for explaining a write operation of the magnetoresistive element, and is a sectional view of the magnetoresistive element in an antiparallel state;

FIGS. 6, 7, 8, and 9 are sectional views showing the manufacturing steps of the magnetoresistive element MTJ according to the first embodiment;

FIGS. 15, 16, and 17 are sectional views showing the manufacturing steps of the magnetoresistive element MTJ according to the third embodiment.

DETAILED DESCRIPTION

Figure 1:
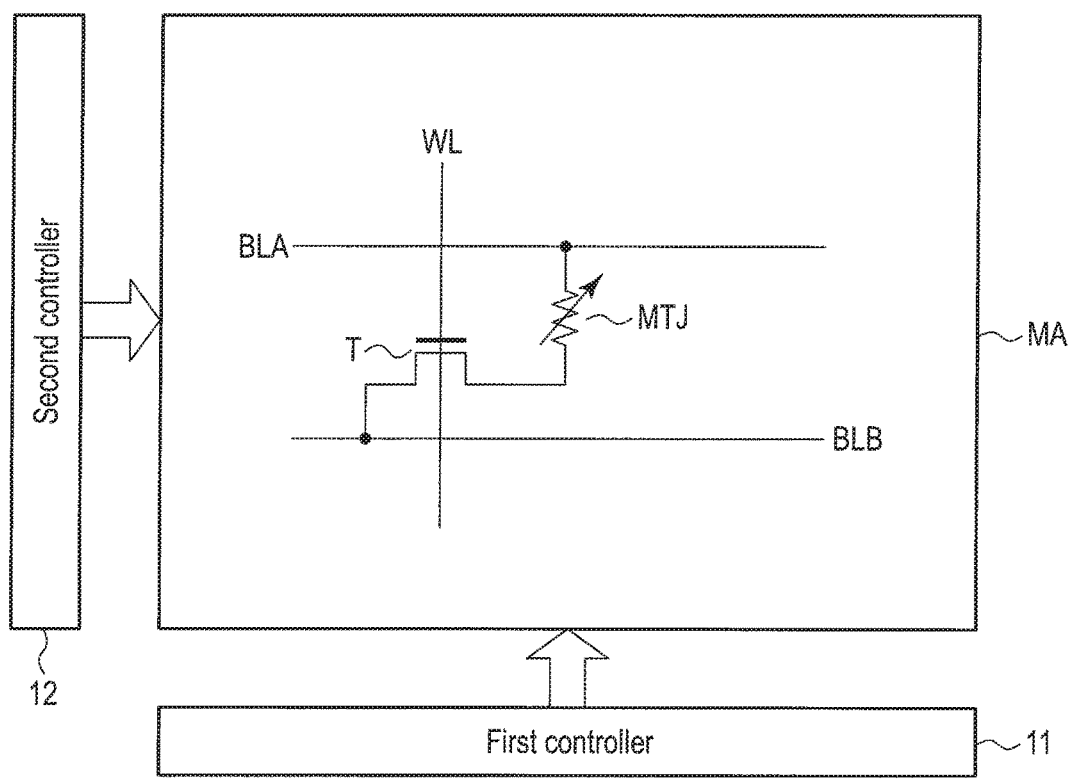
FIG. 1 is a circuit diagram showing a memory cell of an MRAM.

In general, according to one embodiment, a magnetoresistive element comprises a storage layer as a ferromagnetic layer which has magnetic anisotropy perpendicular to film planes, and in which a magnetization direction is variable, a reference layer as a ferromagnetic layer which has magnetic anisotropy perpendicular to film planes, and in which a magnetization direction is invariable, a tunnel barrier layer as a nonmagnetic layer formed between the storage layer and the reference layer, and a first underlayer formed on a side of the reference layer, which is opposite to a side facing the tunnel barrier layer, and containing amorphous W.

This embodiment will be explained below with reference to the accompanying drawings. In these drawings, the same reference numerals denote the same parts. Also, a repetitive explanation will be made as needed.

<MRAM Basic Configuration Example>

A basic configuration example of an MRAM will be explained below with reference to FIGS. 1, 2, 3A, 3B, and 3C.

FIG. 1 is a circuit diagram showing a memory cell of the MRAM.

As shown in FIG. 1, the memory cell in a memory cell array MA includes a series circuit of a magnetoresistive element MTJ and a switching element (e.g., an FET) T. One terminal of this series circuit (one terminal of the magnetoresistive element MTJ) is connected to a bit line BLA, and the other terminal of the series circuit (one terminal of the switching element T) is connected to a bit line BLB. The control terminal of the switching element T, e.g., the gate electrode of the FET is connected to a word line WL.

A first controller 11 controls the potential of the word line WL. A second controller 12 controls the potentials of the bit lines BLA and BLB.

FIG. 2 is a sectional view showing the structure of the memory cell of the MRAM.

As shown in FIG. 2, the memory cell includes the switching element T and magnetoresistive element MTJ arranged on a semiconductor substrate 21.

The semiconductor substrate 21 is, e.g., a silicon substrate, and its conductivity type can be either a p-type or n-type. In the semiconductor substrate 21, an element isolation insulating layer 22, e.g., an $SiO_2$ (silicon oxide) layer having an STI structure is formed.

The switching element T is formed in the surface region of the semiconductor substrate 21, more specifically, in an element region (active area) surrounded by the element isolation insulating layer 22. In this example, the switching element T is an FET, and includes two source/drain diffusion layers 23 formed in the semiconductor substrate 21, and a gate electrode 24 formed on a channel region between them. The gate electrode 24 functions as the word line WL.

The switching element T is covered with an interlayer dielectric layer (e.g., $SiO_2$) 25. A contact hole is formed in the interlayer dielectric layer 25, and a contact via 26 is formed in the contact hole. The contact via 26 is made of a metal material such as W or Cu.

The lower surface of the contact via 26 is connected to the switching element. In this example, the contact via 26 is in direct contact with the source/drain diffusion layer 23.

A lower electrode (LE) 27 is formed on the contact via 26. The lower electrode 27 has, e.g., a multilayered structure including Ta (10 nm)/Ru (5 nm)/Ta (5 nm).

The magnetoresistive element MTJ is formed on the lower electrode 27, i.e., immediately above the contact via 26. Details of the magnetoresistive element MTJ according to the first embodiment will be described later.

An upper electrode (UE) 28 is formed on the magnetoresistive element MTJ. The upper electrode 28 is made of, e.g., TiN. The upper electrode 28 is connected to the bit line (e.g., Cu) BLA via a via (e.g., Cu) 29.

FIG. 3A is a sectional view showing the structure of the magnetoresistive element MTJ. FIG. 3A mainly shows a storage layer 31, tunnel barrier layer 32, and reference layer 33 as the magnetoresistive element MTJ.

As shown in FIG. 3A, the magnetoresistive element MTJ includes the storage layer 31 as a ferromagnetic layer, the reference layer 33 as a ferromagnetic layer, and the tunnel barrier layer 32 as a nonmagnetic layer formed between them.

The storage layer 31 is a ferromagnetic layer in which the magnetization direction is variable, and has perpendicular magnetic anisotropy perpendicular to or almost perpendicular to the film planes (upper surface/lower surface). "The magnetization direction is variable" herein mentioned means that the magnetization direction changes in accordance with a predetermined write current. Also, "almost perpendicular" means that the direction of residual magnetization falls within the range of $45°<\theta\leq90°$ with respect to the film planes.

The tunnel barrier layer 32 is formed on the storage layer 31. The tunnel barrier layer 32 is a nonmagnetic layer and made of, e.g., MgO.

The reference layer 33 is formed on the tunnel barrier layer 32. The reference layer 33 is a ferromagnetic layer in which the magnetization direction is invariable, and has perpendicular magnetic anisotropy perpendicular to or almost perpendicular to the film planes. "The magnetization direction is invariable" herein mentioned means that the magnetization direction does not change in accordance with a predetermined write current. That is, the magnetization direction reversal energy barrier is larger in the reference layer 33 than in the storage layer 31.

FIG. 3B is a view for explaining a write operation of the magnetoresistive element MTJ, and is a sectional view of the magnetoresistive element MTJ in a parallel state. FIG. 3C is a view for explaining a write operation of the magnetoresistive element MTJ, and is a sectional view of the magnetoresistive element MTJ in an antiparallel state.

The magnetoresistive element MTJ is, e.g., a spin-transfer torque magnetoresistive element. Accordingly, when writing data into the magnetoresistive element MTJ or reading data from the magnetoresistive element MTJ, currents are bidirectionally supplied to the magnetoresistive element MTJ in the direction perpendicular to the film planes.

More specifically, data is written in the magnetoresistive element MTJ as follows.

When a current flows from the lower electrode 27 to the upper electrode 28, i.e., when electrons are supplied from the upper electrode 28 (when electrons move from the reference layer 33 to the storage layer 31), electrons spin-polarized in the same direction as the magnetization direction in the reference layer 33 are injected into the storage layer 31. In this case, the magnetization direction in the storage layer 31 is matched with that in the reference layer 33. Consequently, the magnetization directions in the reference layer 33 and storage layer 31 are arranged parallel to each other. In this parallel state, the resistance value of the magnetoresistive element MTJ is smallest. This state is defined as, e.g., data "0".

On the other hand, when a current flows from the upper electrode 28 to the lower electrode 27, i.e., when electrons are supplied from the lower electrode 27 (when electrons move from the storage layer 31 to the reference layer 33), electrons spin-polarized in the direction opposite to the magnetization direction in the reference layer 33 as they are reflected by the reference layer 33 are injected into the storage layer 31. In this case, the magnetization direction in the storage layer 31 is matched with the direction opposite to that in the reference layer 33. Consequently, the magnetization directions in the reference layer 33 and storage layer 31 are arranged antiparallel to each other. In this antiparallel state, the resistance value of the magnetoresistive element MTJ is largest. This state is defined as, e.g., data "1".

Also, data is read from the magnetoresistive element MTJ as follows.

A read current is supplied to the magnetoresistive element MTJ. This read current is set at a value at which the magnetization direction in the storage layer 31 does not reverse (i.e., a value smaller than that of the write current). Data "0" or "1" described above can be read out by detecting the change in resistance value of the magnetoresistive element MTJ.

First Embodiment

A magnetoresistive element MTJ according to the first embodiment will be explained below with reference to FIGS. 4, 5, 6, 7, 8, 9, 10, 11, and 12. The first embodiment is an example in which a storage layer 31 is formed in contact with a first underlayer 43 containing amorphous W. This can increase the perpendicular magnetic anisotropy of the storage layer 31. The first embodiment will be explained in detail below.

[Structure of First Embodiment]

The structure of the magnetoresistive element MTJ according to the first embodiment will be explained below with reference to FIG. 4.

Figure 4:
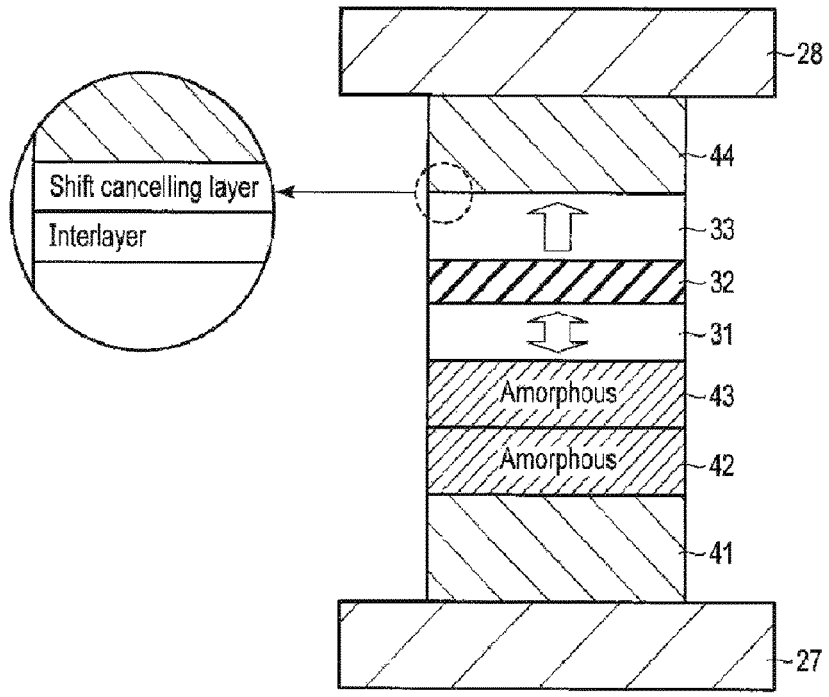
FIG. 4 is a sectional view showing the structure of a magnetoresistive element MTJ according to the first embodiment.

FIG. 4 is a sectional view showing the structure of the magnetoresistive element MTJ according to the first embodiment.

As shown in FIG. 4, the magnetoresistive element MTJ includes a buffer layer 41, a second underlayer 42, the first underlayer 43, the storage layer 31, a tunnel barrier layer 32, and a reference layer 33.

The buffer layer 41 is formed on a lower electrode 27. The buffer layer 41 contains a high melting point metal material. This makes it possible to prevent the metal material of the buffer layer 41 from diffusing toward the tunnel barrier layer 32, and deteriorating the characteristics of the magnetoresistive element MTJ. It is also possible to prevent the metal material of the lower electrode 27 positioned below the buffer layer 41 from diffusing toward the tunnel barrier layer 32. Examples of the high melting point metal material as described above are W, Mo, and Ta.

The second underlayer 42 is formed on the buffer layer 41. The second underlayer 42 is, e.g., a nonmagnetic layer containing amorphous CoFeB. The second underlayer 42 is a base layer for amorphousizing the first underlayer 43. The second underlayer 42 can also contain partially crystallized CoFeB. That is, the second underlayer 42 can contain, e.g., amorphous CoFeB and crystalline (single-crystal or/and polycrystalline) CoFeB. Note that the second underlayer 42 need not necessarily contain amorphous CoFeB, and need only contain an amorphous conductive material. Normally, a metal to which a metalloid element is added is readily amorphousized. Therefore, an example of the amorphous conductive material is a metal to which a metalloid such as B, S, C, P, Al, Ge, or Ga is added.

Note that each material can be either crystalline or amorphous unless otherwise specified.

The thickness of the second underlayer 42 is 1 Å or more to 20 Å or less. This lower limit is a value required for the amorphous second underlayer 42 to amorphousize the first underlayer 43. On the other hand, the upper limit is a value required for the second underlayer 42 to be demagnetized by the first underlayer 43 as a nonmagnetic layer. That is, the thickness of the second underlayer 42 is large enough to amorphousize the first underlayer 43 by the second underlayer 42, and small enough to demagnetize the second underlayer 42 by the first underlayer 43. Note that the upper limit is effective when using a magnetic material such as CoFeB, and is not particularly restricted when using a nonmagnetic material.

The first underlayer 43 is formed on the second underlayer 42. The first underlayer 43 is a nonmagnetic layer containing amorphous W. The first underlayer 43 is formed in contact with the storage layer 31, and hence has a function of increasing the perpendicular magnetic anisotropy of the storage layer 31. W forming the first underlayer 43 is amorphousized when formed by using the second underlayer 42 containing an amorphous material (e.g., amorphous CoFeB) as a base. Also, the first underlayer 43 as a nonmagnetic layer containing a nonmagnetic material demagnetizes the second underlayer 42 as a ferromagnetic layer.

The thickness of the first underlayer 43 is 8 Å or more to 20 Å or less. This lower limit is a value required for the first underlayer 43 as a nonmagnetic layer to demagnetize the second underlayer 42. On the other hand, the upper limit is a value required for the first underlayer 43 to be amorphousized by the amorphous second underlayer 42. That is, the thickness of the first underlayer 43 is large enough to demagnetize the second underlayer 42 by the first underlayer 43, and small enough to amorphousize the first underlayer 43 by the second underlayer 42.

Note that the thicknesses of the first underlayer 43 and second underlayer 42 are not limited to the abovementioned values. As described above, these thicknesses are appropriately adjusted within the range over which the amorphous second underlayer 42 amorphousizes the first underlayer 43, and the first underlayer 43 as a nonmagnetic layer demagnetizes the second underlayer 42.

The storage layer 31 is formed on the first underlayer 43. The storage layer 31 is a ferromagnetic layer containing ferromagnetic materials such as Co and Fe. Also, B is added to the ferromagnetic materials in order to adjust the saturation magnetization or magneto crystalline anisotropy. That is, the storage layer 31 is made of a compound such as crystalline CoFeB.

The thickness of the storage layer 31 is 8 Å or more to 30 Å or less. This lower limit is a value required for the storage layer 31 to have a sufficient MR (Magnetic Resistance) ratio. On the other hand, the upper limit is a value required for the storage layer 31 to have a sufficient perpendicular magnetic anisotropy. In other words, if the thickness of the storage layer 31 exceeds 30 Å, the storage layer 31 loses its perpendicular magnetic anisotropy.

The tunnel barrier layer 32 is formed on the storage layer 31. The tunnel barrier layer 32 is a nonmagnetic layer containing a nonmagnetic material such as MgO. However, the nonmagnetic material is not limited to this, and the tunnel barrier layer 32 may also contain a metal oxide such as $Al_2O_3$, MgAlO, ZnO, or TiO.

The reference layer 33 is formed on the tunnel barrier layer 32. The reference layer 33 includes, e.g., a first reference layer (not shown) formed on the side of the tunnel barrier layer 32, and a second reference layer (not shown) formed on the side of a hard mask 44 (to be described later). The first reference layer is a ferromagnetic layer containing ferromagnetic materials such as Co and Fe. Also, B is added to the ferromagnetic materials in order to adjust the saturation magnetization or magneto crystalline anisotropy. That is, the first reference layer is made of a compound such as crystalline CoFeB. The second reference layer is a ferromagnetic layer formed by a multilayered film obtained by stacking a plurality of layers made of a ferromagnetic material such as Co and a nonmagnetic material such as Pt.

The hard mask 44 is formed on the reference layer 33. The hard mask 44 is made of a conductive metal material, e.g., TiN. However, the hard mask 44 is not limited to this material, and may also be formed by a film containing Ti, Ta, or W, or a multilayered film containing these metals.

An upper electrode 28 is formed on the hard mask 44. Since the upper electrode 28 is formed in contact with the hard mask 44 made of a metal material, the upper electrode 28 and magnetoresistive element MTJ are electrically connected via the hard mask 34.

The planar shape of the buffer layer 41, second underlayer 42, first underlayer 43, storage layer 31, tunnel barrier layer 32, reference layer 33, and hard mask 44 is, e.g., a circle. Therefore, the magnetoresistive element MTJ is formed into a pillar shape. However, the planar shape of the magnetoresistive element MTJ is not limited to this, and may also be a square, rectangle, or ellipse.

Note that a shift cancelling layer may also be formed on the reference layer 33 with an interlayer being sandwiched between them. See FIG. 4. The interlayer contains a conductive material such as Ru. The shift cancelling layer is a magnetic layer in which the magnetization direction is invariable, and has perpendicular magnetic anisotropy perpendicular to or almost perpendicular to the film planes. Also, this magnetization direction is opposite to that in the reference layer 33. As a consequence, the shift cancelling layer can cancel a leakage magnetic field applied from the reference layer 33 to the storage layer 31. In other words, the shift cancelling layer has an effect of adjusting, in the opposite direction, the reversal characteristic offset applied on the storage layer 31 by the leakage magnetic field from the reference layer 33. This shift cancelling layer is formed by, e.g., an artificial lattice having a multilayered structure including a magnetic material such as Ni, Fe, or Co and a nonmagnetic material such as Cu, Pd, or Pt.

Note also that the storage layer 31 and reference layer 33 can have a planar dimensional difference. For example, the diameter of the reference layer 33 can be smaller than that of the storage layer 31 in a plane. This makes it possible to prevent en electrical shortcircuit between the storage layer 31 and reference layer 33.

[Manufacturing Method of First Embodiment]

A method of manufacturing the magnetoresistive element MTJ according to the first embodiment will be explained below with reference to FIGS. 5, 6, 7, 8, and 9.

Figure 5:
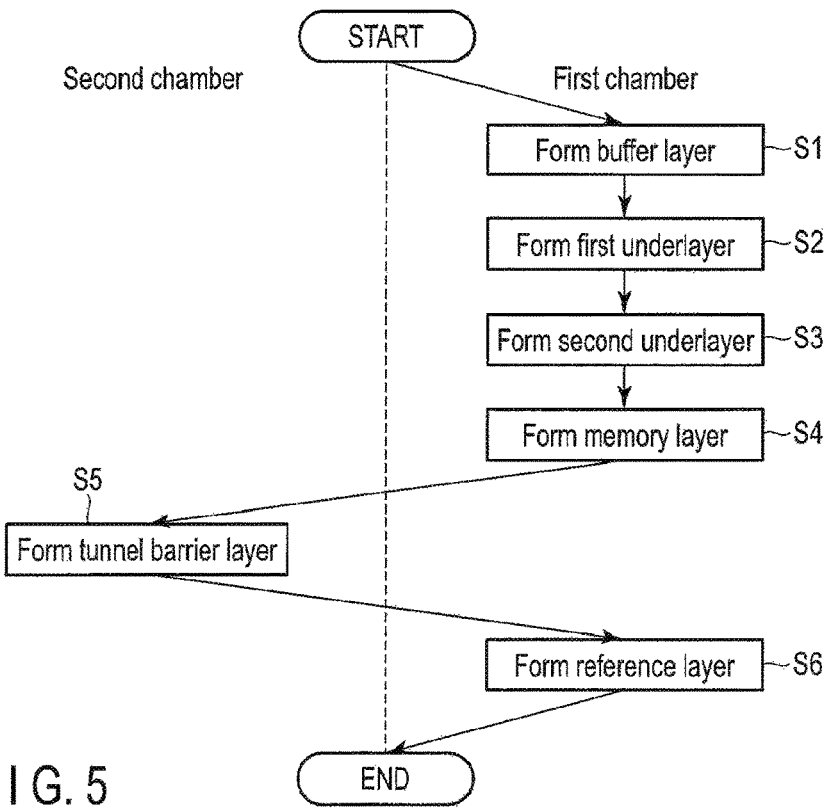
FIG. 5 is a flowchart showing a method of manufacturing the magnetoresistive element MTJ according to the first embodiment.

FIG. 5 is a flowchart showing the method of manufacturing the magnetoresistive element MTJ according to the first embodiment. FIG. 5 mainly shows the formation of the buffer layer 41, second underlayer 42, first underlayer 43, storage layer 31, tunnel barrier layer 32, and reference layer 33, and transfer between chambers during the formation. Note that the magnetoresistive element MTJ is formed by using two chambers, i.e., first and second chambers in this example as will be described below, but the present embodiment is not limited to this. It is also possible to use three or more chambers by reducing the number of layers that can be deposited in one chamber.

FIGS. 6, 7, 8, and 9 are sectional views showing the manufacturing steps of the magnetoresistive element MTJ according to the first embodiment.

Figure 6:
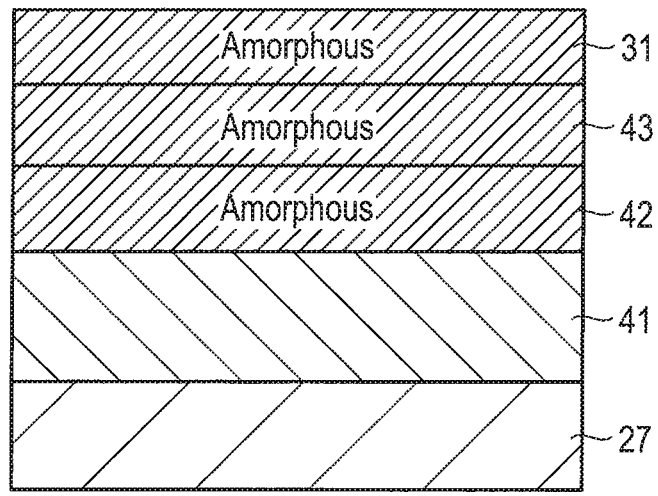

First, as shown in FIGS. 5 and 6, a buffer layer 41 is formed on a lower electrode 27 in step S1. For example, the buffer layer 41 is formed by sputtering in the first chamber. The buffer layer 41 contains a high melting point metal material. Examples of the high melting point metal material are W, Mo, and Ta.

Then, in step S2, a second underlayer 42 is formed on the buffer layer 41. For example, the second underlayer 42 is formed by sputtering in the first chamber like the buffer layer 41. The second underlayer 42 is a ferromagnetic layer containing amorphous CoFeB. The amorphous second underlayer 42 functions as a base layer for amorphousizing a first underlayer 43 to be formed later. The thickness of the second underlayer 42 is 1 Å or more to 20 Å or less.

CoFeB forming the second underlayer 42 is a material that can easily be amorphousized when formed. Therefore, amorphous CoFeB is readily formable by sputtering. The deposition condition is that the temperature is equal to or lower than the crystallization temperature of CoFeB, i.e., about 300° C. or less.

Subsequently, in step S3, a first underlayer 43 is formed on the second underlayer 42. For example, the first underlayer 43 is formed by sputtering in the first chamber like the second underlayer 42. The first underlayer 43 is a nonmagnetic layer containing amorphous W. The first underlayer 43 is formed in contact with the storage layer 31, and hence has a function of increasing the perpendicular magnetic anisotropy of the storage layer 31. The thickness of the first underlayer 43 is 8 Å or more to 20 Å or less.

W forming the first underlayer 43 is normally a material that can easily be crystallized when formed. In the first embodiment, W forming the first underlayer 43 is formed by using the amorphous second underlayer 42 as a base, and is formed to have a thickness of 20 Å or less. Accordingly, W forming the first underlayer 43 can be formed as amorphous W by taking over the amorphousness of the amorphous second underlayer 42 (amorphous CoFeB).

Also, the first underlayer 43 is a nonmagnetic layer, and formed to have a thickness of 8 Å or more. Therefore, the first underlayer 43 demagnetizes the second underlayer 42 as a ferromagnetic layer.

In step S4, a storage layer 31 is formed on the first underlayer 43. For example, the storage layer 31 is formed by sputtering in the first chamber like the first underlayer 43. The storage layer 31 is a ferromagnetic layer containing amorphous CoFeB. The thickness of the storage layer 31 is 8 Å or more to 15 Å or less.

CoFeB forming the storage layer 31 is a material that can easily be amorphousized when formed. Therefore, amorphous CoFeB is readily formable by sputtering. Also, the storage layer 31 is formed on the first underlayer 43 made of amorphous W, and hence has perpendicular magnetic anisotropy higher than that when it is formed singly.

Figure 7:
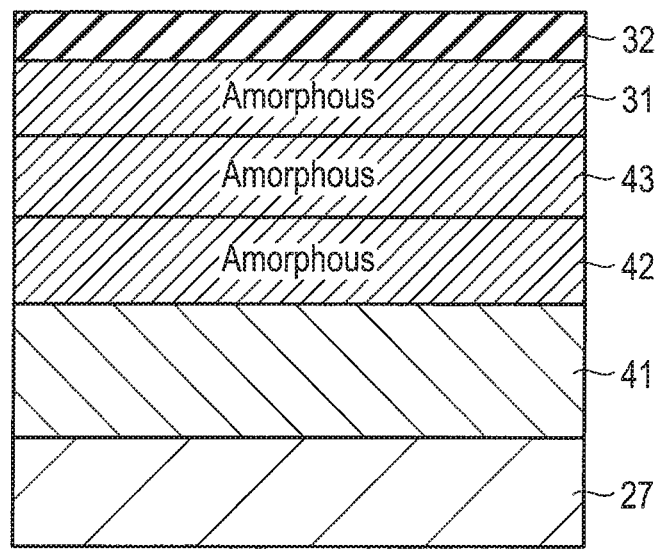

As shown in FIGS. 5 and 7, a tunnel barrier layer 32 is formed on the storage layer 31. For example, the tunnel barrier layer 32 is formed by sputtering in the second chamber after the substrate is transferred from the first chamber to the second chamber. This transfer from the first chamber to the second chamber is performed in a vacuum. The tunnel barrier layer 32 is a nonmagnetic layer containing a nonmagnetic material such as MgO.

As shown in FIGS. 5 and 8, a reference layer 33 is formed on the tunnel barrier layer 32. For example, the reference layer 33 is formed by sputtering in the first chamber after the substrate is transferred from the second chamber to the first chamber. This transfer from the second chamber to the first chamber is performed in a vacuum. The reference layer 33 is formed by first forming a first reference layer on the tunnel barrier layer 32, and then forming a second reference layer on the first reference layer. The first reference layer is a ferromagnetic layer containing ferromagnetic materials such as Co and Fe. The second reference layer is a ferromagnetic layer formed by a multilayered film obtained by stacking a plurality of layers made of a ferromagnetic material such as Co and a nonmagnetic material such as Pt.

After that, the layers of the magnetoresistive element MTJ are crystallized by annealing.

In this step, amorphous CoFeB contained in the storage layer 31 is in contact with highly crystalline MgO (the tunnel barrier layer 32). Based on the crystallinity of MgO, therefore, CoFeB of the storage layer 31 crystallizes from the MgO side so as to match with the lattice of MgO.

On the other hand, amorphous W contained in the first underlayer 43 does not crystallize because the thickness is small. Also, amorphous CoFeB contained in the second underlayer 42 is not in contact with MgO, but in contact with amorphous W contained in the first underlayer 43. Accordingly, CoFeB of the second underlayer 42 does not crystallize.

Note that amorphous CoFeB contained in the second underlayer 42 is in contact with the buffer layer 41. If the buffer layer 41 is made of a highly crystalline material, therefore, the second underlayer 42 partially crystallizes from the side of the buffer layer 41.

Then, as shown in FIG. 9, a hard mask 44 is formed on the reference layer 33, and patterned such that the planar shape becomes, e.g., circular. The hard mask 44 is made of a conductive metal material, e.g., TiN. However, the hard mask 44 is not limited to this material, and may also be formed by a film containing Ti, Ta, or W, or a multilayered film containing these metals. Consequently, the hard mask need not be removed later, and can be used as a contact portion for an upper electrode 28.

Subsequently, the reference layer 33, tunnel barrier layer 32, storage layer 31, first underlayer 43, second underlayer 42, and buffer layer 41 are processed by physical etching such as IBE (Ion Beam Etching) using the hard mask 44 as a mask. As a consequence, the reference layer 33, tunnel barrier layer 32, storage layer 31, first underlayer 43, second underlayer 42, and buffer layer 41 are patterned into a circular planar shape like the hard mask.

After that, an interlayer dielectric layer (not shown) made of, e.g., $SiO_2$ is formed on the entire surface by CVD or the like. Consequently, the interlayer dielectric layer is buried between adjacent magnetoresistive elements MTJ. Then, the interlayer dielectric layer formed on the magnetoresistive element MTJ is planarized and etched back. This exposes the upper surface of the magnetoresistive element MTJ. An upper electrode 28 is formed on the exposed magnetoresistive element MTJ, and electrically connected to it.

Thus, the magnetoresistive element MTJ according to the first embodiment is formed.

[Effects of First Embodiment]

In the magnetoresistive element MTJ according to the abovementioned first embodiment, the storage layer 31 is formed in contact with the first underlayer 43 containing amorphous W, on the side opposite to the tunnel barrier layer 32. This can achieve the following effects.

Figure 10:
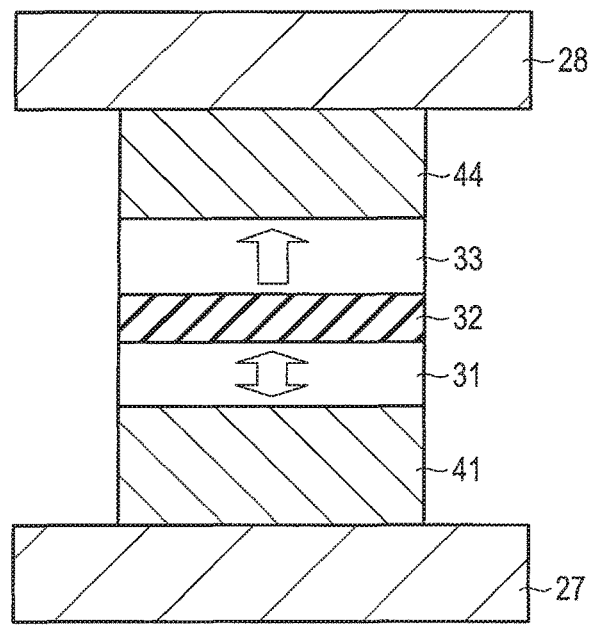
FIG. 10 is a sectional view showing the structure of a magnetoresistive element MTJ according to a comparative example.
Figure 11:
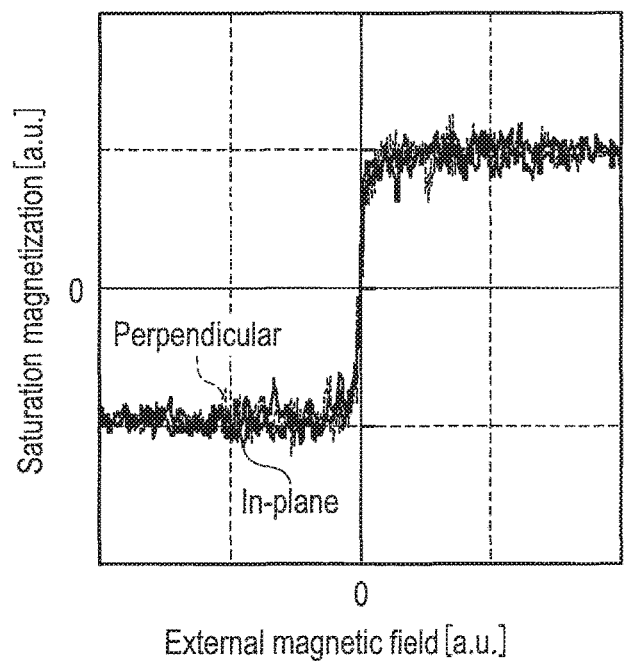
FIG. 11 is a graph showing the perpendicular magnetic anisotropy of a storage layer 31 obtained by W according to the comparative example.
Figure 12:
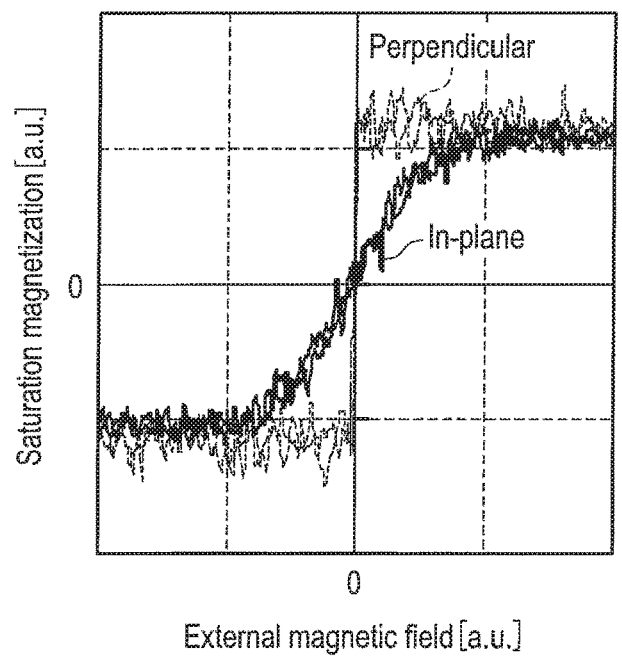
FIG. 12 is a graph showing the perpendicular magnetic anisotropy of a storage layer 31 obtained by W according to the first embodiment.

FIG. 10 is a sectional view showing the structure of a magnetoresistive element MTJ according to a comparative example. FIG. 11 is a graph showing the perpendicular magnetic anisotropy of a storage layer 31 obtained by W (a buffer layer 41) according to the comparative example. FIG. 12 is a graph showing the perpendicular magnetic anisotropy of the storage layer 31 obtained by W (the first underlayer 43) according to the first embodiment. More specifically, FIG. 11 shows the relationship between a magnetic field (external magnetic field) to be applied to the crystalline W and the storage layer 31 and a magnetization obtained by the magnetic field. FIG. 12 shows the relationship between a magnetic field to be applied to the amorphous W and the storage layer 31 and a magnetization obtained by the magnetic field.

As shown in FIG. 10, in the magnetoresistive element MTJ according to the comparative example, the buffer layer 41 is formed on an underlayer 27, and the storage layer 31 is formed on the buffer layer 41. The buffer layer 41 contains crystalline W, and the storage layer 31 contains crystalline CoFeB. That is, unlike in the first embodiment, crystalline CoFeB contained in the storage layer 31 is formed in contact with crystalline W contained in the buffer layer 41 in the comparative example.

In the comparative example as described above, as shown in FIG. 11, a magnetic field with which magnetization saturates when an in-plane magnetic field is applied to crystalline W and the storage layer 31 is almost equal to a magnetic field with which magnetization saturates when a perpendicular magnetic field is applied. In other words, the perpendicular magnetic anisotropy of crystalline W and the storage layer 31 is low.

By contrast, in the first embodiment as shown in FIG. 12, a magnetic field with which magnetization saturates when an in-plane magnetic field is applied to amorphous W and the storage layer 31 is larger than a magnetic field with which magnetization saturates when a perpendicular magnetic field is applied. In other words, magnetization saturates when a perpendicular magnetic field is close to 0, but in-plane magnetization does not saturate when an in-plane magnetic field is close to 0. That is, magnetization is perpendicular when a magnetic field is close to 0. That is, the perpendicular magnetic anisotropy is high.

In the first embodiment as described above, the perpendicular magnetic anisotropy of the storage layer 31 can be increased because the storage layer 31 is in contact with amorphous W. Consequently, the thermal stability (data retention characteristic) of the storage layer 31 can be improved.

Also, W is used as the storage layer 31 in the first embodiment. W has a high thermal durability. Therefore, amorphous W can be maintained without particularly taking account of restrictions on the later annealing step and the like.

Note that in the first embodiment, the second underlayer 42 need not be formed if the first underlayer 43 can contain amorphous W. In this case, W can easily be amorphousized by adding a metalloid element such as B, Si, S, C, P, Al, Ge, or Ga to W of the first underlayer 43.

Furthermore, the buffer layer 41 need not be formed if there is no possibility that the metal material of, e.g., the lower electrode 27 diffuses.

Second Embodiment

A magnetoresistive element MTJ according to the second embodiment will be explained below with reference to FIG. 13. In the first embodiment, the first underlayer 43 demagnetizes the second underlayer 42. By contrast, the second embodiment is an example in which a second underlayer 42 is not demagnetized because a first underlayer 43 is thinned, and the second underlayer 42 and a storage layer 31 are formed as one magnetic layer (one storage layer). Details of the second embodiment will be explained below.

Note that in the second embodiment, an explanation of the same features as those of the abovementioned first embodiment will be omitted, and different points will mainly be explained.

[Structure of Second Embodiment]

The structure of the magnetoresistive element MTJ according to the second embodiment will be explained below with reference to FIG. 13.

Figure 13:
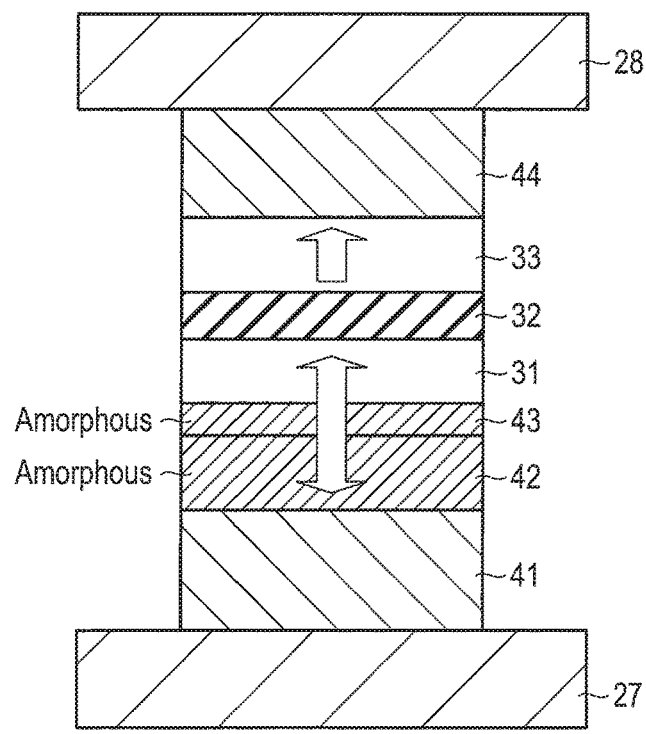
FIG. 13 is a sectional view showing the structure of a magnetoresistive element MTJ according to the second embodiment.

FIG. 13 is a sectional view showing the structure of the magnetoresistive element MTJ according to the second embodiment.

As shown in FIG. 13, the second embodiment differs from the first embodiment in that the first underlayer 43 is thinned, and the second underlayer 42 is a magnetic layer. The structure of the second embodiment will be explained in detail below.

The second underlayer 42 is formed on a buffer layer 41. The second underlayer 42 is a magnetic layer containing, e.g., amorphous CoFeB. The second underlayer 42 is a base layer for amorphousizing the first underlayer 43. The second underlayer 42 can also contain partially crystallized CoFeB. That is, the second underlayer 42 contains, e.g., amorphous CoFeB and crystalline (single-crystal or/and polycrystalline) CoFeB.

The thickness of the second underlayer 42 is 3 Å or more to 15 Å or less. This lower limit is required for the second underlayer 42 to achieve ferromagnetism. On the other hand, the upper limit is a value required for the second underlayer 42 to have a sufficient perpendicular magnetic anisotropy. In other words, if the thickness of the second underlayer 42 exceeds 15 Å, the second underlayer 42 loses its perpendicular magnetic anisotropy.

The first underlayer 43 is formed on the second underlayer 42. The first underlayer 43 is a nonmagnetic layer containing amorphous W. The first underlayer 43 is formed in contact with the storage layer 31, and hence has a function of increasing the perpendicular magnetic anisotropy of the storage layer 31. W forming the first underlayer 43 is amorphousized when formed by using the second underlayer 42 containing the amorphous material (e.g., amorphous CoFeB) as a base. Also, the first underlayer 43 as a nonmagnetic layer does not demagnetize the second underlayer 42 as a ferromagnetic layer. In other words, the first underlayer 43 exerts no influence on the ferromagnetism of the second underlayer 42.

The thickness of the first underlayer 43 is 1 Å or more to 3 Å or less. Accordingly, the first underlayer 43 as a nonmagnetic layer exerts no influence on the ferromagnetism of the second underlayer 42 as a ferromagnetic layer.

The storage layer 31 is formed on the first underlayer 43. The storage layer 31 is a ferromagnetic layer containing ferromagnetic materials such as Co and Fe. Also, B is added to the ferromagnetic materials in order to adjust the saturation magnetization or magneto crystalline anisotropy. That is, the storage layer 31 is made of a compound such as crystalline CoFeB. The thickness of the storage layer 31 is 8 Å or more to 15 Å or less.

As described above, the storage layer 31 and second underlayer 42 can function as one ferromagnetic layer (one storage layer) because the first underlayer 43 as a nonmagnetic layer does not demagnetize the second underlayer 42. In other words, both the storage layer 31 and second underlayer 42 are ferromagnetic layers in each of which the magnetization direction is variable, and their magnetization directions similarly change. This makes it possible to increase the thickness of the ferromagnetic layer functioning as a storage layer, and improve the data retention characteristic.

[Manufacturing Method of Second Embodiment]

A method of manufacturing the magnetoresistive element MTJ according to the second embodiment will be explained below.

First, a buffer layer 41 is formed on a lower electrode 27 as in the first embodiment.

Then, a second underlayer 42 is formed on the buffer layer 41. The second underlayer 42 is a ferromagnetic layer containing amorphous CoFeB. The amorphous second underlayer 42 is a base layer for amorphousizing a first underlayer 43 to be formed later. The thickness of the second underlayer 42 is 3 Å or more to 20 Å or less.

Subsequently, a first underlayer 43 is formed on the second underlayer 42. The first underlayer 43 is a nonmagnetic layer containing amorphous W. The first underlayer 43 is formed in contact with a storage layer 31, and hence has a function of increasing the perpendicular magnetic anisotropy of the storage layer 31. The thickness of the first underlayer 43 is 1 Å or more to 3 Å or less. Therefore, the first underlayer 43 does not demagnetize the second underlayer 42 as a ferromagnetic layer. In other words, the first underlayer 43 exerts no influence on the ferromagnetism of the second underlayer 42.

A storage layer 31 is formed on the first underlayer 43. The storage layer 31 is a ferromagnetic layer containing amorphous CoFeB. The thickness of the storage layer 31 is 8 Å or more to 15 Å or less. The storage layer 31 is formed on the first underlayer 43 made of amorphous W, and hence has perpendicular magnetic anisotropy higher than that when it is formed singly.

After that, the same steps as in the first embodiment are performed.

That is, a tunnel barrier layer 32 is formed on the storage layer 31, and a reference layer 33 is formed on the tunnel barrier layer 32. After that, a patterned hard mask 44 is formed on the reference layer 33, and the reference layer 33, tunnel barrier layer 32, storage layer 31, first underlayer 43, second underlayer 42, and buffer layer 41 are processed by using the hard mask 44 as a mask. Then, an upper electrode 28 is formed on the hard mask 44 and electrically connected to it.

In addition, the layers of the magnetoresistive element MTJ are crystallized by annealing.

In this step, amorphous CoFeB contained in the storage layer 31 is in contact with highly crystalline MgO (the tunnel barrier layer 32). Based on the crystallinity of MgO, therefore, CoFeB of the storage layer 31 crystallizes from the MgO side so as to match with the lattice of MgO.

On the other hand, amorphous W contained in the first underlayer 43 does not crystallize because the thickness is small. Also, amorphous CoFeB contained in the second underlayer 42 is not in contact with MgO, but in contact with amorphous CoFeB contained in the first underlayer 43. Accordingly, CoFeB contained in the second underlayer 42 does not crystallize.

Note that amorphous CoFeB contained in the second underlayer 42 is in contact with the buffer layer 41. When the buffer layer 41 is made of a highly crystalline material, therefore, the second underlayer 42 partially crystallizes from the side of the buffer layer 41.

Thus, the magnetoresistive element MTJ according to the second embodiment is formed.

[Effects of Second Embodiment]

The abovementioned second embodiment can achieve the same effects as those of the first embodiment.

In addition, in the second embodiment, the second underlayer 42 is not demagnetized because the first underlayer 43 is thinned. This makes it possible to form the storage layer 31 and second underlayer 42 as one ferromagnetic layer (one storage layer), thereby increasing the thickness of the ferromagnetic layer functioning as a storage layer. As a consequence, the data retention characteristic can be improved.

Third Embodiment

A magnetoresistive element MTJ according to the third embodiment will be explained below with reference to FIGS. 14, 15, 16, and 17. The third embodiment is an example in which the abovementioned embodiments are applied to a structure in which the positions of a storage layer 31 and reference layer 33 are switched. Details of the third embodiment will be explained below.

Note that in the third embodiment, an explanation of the same features as those of the aforementioned embodiments will be omitted, and different points will mainly be explained.

[Structure of Third Embodiment]

The structure of the magnetoresistive element MTJ according to the third embodiment will be explained below with reference to FIG. 14.

Figure 14:
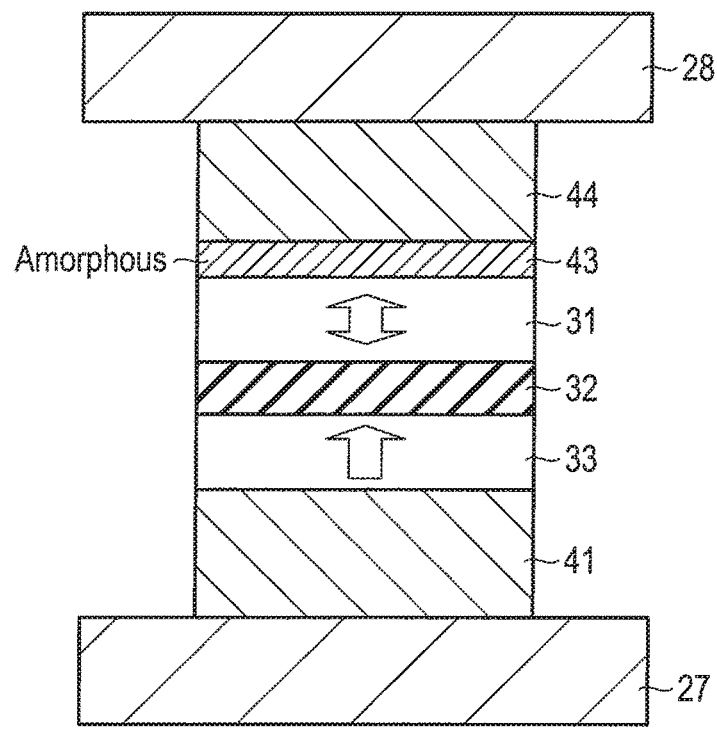
FIG. 14 is a sectional view showing the structure of a magnetoresistive element MTJ according to the third embodiment.

FIG. 14 is a sectional view showing the structure of the magnetoresistive element MTJ according to the third embodiment.

A shown in FIG. 14, the third embodiment differs from the above embodiments in that the positions of the storage layer 31 and reference layer 33 are switched, i.e., a first underlayer 43 is formed on the storage layer 31. In addition, the second underlayer 42 used in the above embodiments is not formed in the third embodiment. This is so because W forming the first underlayer 43 is amorphousized when formed by using the storage layer 31 as a base.

Note that the first underlayer 43 in the third embodiment has the same arrangement as that of the first underlayer 43 in the above embodiments, but does not function as a base of the storage layer 31 in the manufacturing process. The structure of the third embodiment will be explained in detail below.

The reference layer 33 is formed on a buffer layer 41. For example, the reference layer 33 includes a second reference layer (not shown) formed on the side of the buffer layer 41, and a first reference layer (not shown) formed on the side of a tunnel barrier layer 32. The second reference layer is a ferromagnetic layer formed by a multilayered film obtained by stacking a plurality of layers made of a ferromagnetic material such as Co and a nonmagnetic material such as Pt. The first reference layer is a ferromagnetic layer containing ferromagnetic materials such as Co and Fe. Also, B is added to the ferromagnetic materials in order to adjust the saturation magnetization or magneto crystalline anisotropy. That is, the first reference layer is made of a compound such as CoFeB.

The tunnel barrier layer 32 is formed on the reference layer 33. The tunnel barrier layer 32 is a nonmagnetic layer containing a nonmagnetic material such as MgO.

The storage layer 31 is formed on the tunnel barrier layer 32. The storage layer 31 is a ferromagnetic layer containing ferromagnetic materials such as Co and Fe. Also, B is added to the ferromagnetic materials in order to adjust the saturation magnetization or magneto crystalline anisotropy. That is, the storage layer 31 is made of a compound such as crystalline CoFeB. The thickness of the storage layer 31 is 8 Å or more to 30 Å or less.

The first underlayer 43 is formed on the storage layer 31. The first underlayer 43 is a nonmagnetic layer containing amorphous W. The first underlayer 43 is formed in contact with the storage layer 31, and hence has a function of increasing the perpendicular magnetic anisotropy of the storage layer 31. W forming the first underlayer 43 is amorphousized when formed by using the storage layer 31 containing the amorphous material (e.g., amorphous CoFeB) as a base in the manufacturing process. Also, the first underlayer 43 as a nonmagnetic layer does not demagnetize the storage layer 31 as a ferromagnetic layer. In other words, the first underlayer 43 exerts no influence on the ferromagnetism of the storage layer 31.

The thickness of the first underlayer 43 is 1 Å or more to 30 Å or less. Accordingly, the first underlayer 43 as a nonmagnetic layer exerts no influence on the ferromagnetism of the storage layer 31 as a ferromagnetic layer.

A hard mask 44 is formed on the first underlayer 43. The hard mask 44 is made of a conductive metal material such as TiN. However, the hard mask 44 is not limited to this material, and may also be formed by a film containing Ti, Ta, or W, or a multilayered film containing these metals.

[Manufacturing Method of Third Embodiment]

A method of manufacturing the magnetoresistive element MTJ according to the third embodiment will be explained below with reference to FIGS. 15, 16, and 17.

Figure 15:
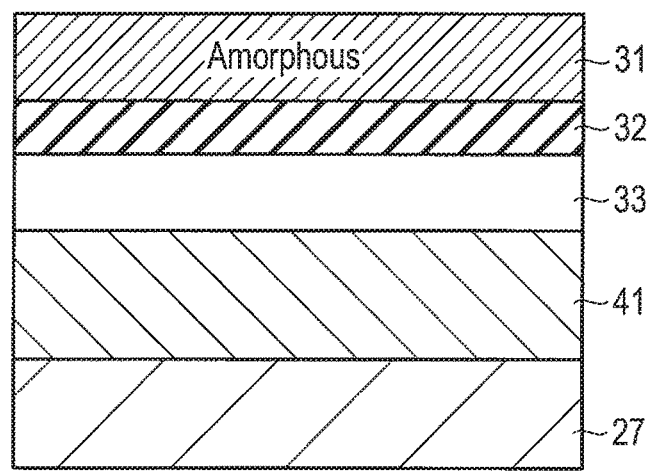

FIGS. 15, 16, and 17 are sectional views showing the manufacturing steps of the magnetoresistive element MTJ according to the third embodiment.

First, as shown in FIG. 15, a buffer layer 41 is formed on a lower electrode 27 as in the first embodiment.

Then, a reference layer 33 is formed on the buffer layer 41. The reference layer 33 is formed by first forming a second reference layer on the buffer layer 41, and then forming a first reference layer on the second reference layer. The first reference layer is a ferromagnetic layer containing ferromagnetic materials such as Co and Fe. The second reference layer is a ferromagnetic layer formed by a multilayered film obtained by stacking a plurality of layers made of a ferromagnetic material such as Co and a nonmagnetic material such as Pt.

Subsequently, a tunnel barrier layer 32 is formed on the reference layer 33. The tunnel barrier layer 32 is a nonmagnetic layer containing a nonmagnetic material such as MgO.

A storage layer 31 is formed on the tunnel barrier layer 32. The storage layer 31 is a ferromagnetic layer containing amorphous CoFeB. The thickness of the storage layer 31 is 8 Å or more to 30 Å or less. The storage layer 31 is formed on the first underlayer 43 made of amorphous W, and hence has perpendicular magnetic anisotropy higher than that when it is formed singly.

As shown in FIG. 16, a first underlayer 43 is formed on the storage layer 31. The first underlayer 43 is a nonmagnetic layer containing amorphous W. The first underlayer 43 is formed in contact with the storage layer 31, and hence has a function of increasing the perpendicular magnetic anisotropy of the storage layer 31. The thickness of the first underlayer 43 is 30 Å or less. Therefore, the first underlayer 43 does not demagnetize the storage layer 31 as a ferromagnetic layer. In other words, the first underlayer 43 exerts no influence on the ferromagnetism of the storage layer 31.

As shown in FIG. 17, a hard mask 44 is formed on the first underlayer 43, and patterned such that the planar shape becomes, e.g., circular. Then, the first underlayer 43, storage layer 31, tunnel barrier layer 32, reference layer 33, and buffer layer 41 are processed by physical etching such as IBE (Ion Beam Etching) using the hard mask 44 as a mask. After that, an upper electrode 28 is formed on the hard mask 44 and electrically connected to it.

In addition, the layers of the magnetoresistive element MTJ are crystallized by annealing.

In this step, amorphous CoFeB contained in the storage layer 31 is in contact with highly crystalline MgO (the tunnel barrier layer 32). Based on the crystallinity of MgO, therefore, CoFeB of the storage layer 31 crystallizes from the MgO side so as to match with the lattice of MgO. On the other hand, amorphous W contained in the first underlayer 43 does not crystallize because the thickness is small.

Thus, the magnetoresistive element MTJ according to the third embodiment is formed.

[Effects of Third Embodiment]

The abovementioned third embodiment can achieve the same effects as those of the first embodiment.

In addition, in the third embodiment, the first underlayer 43 containing amorphous W is formed by using the storage layer 31 containing amorphous CoFeB as a base in the manufacturing process. This obviates the need for the second underlayer 42 used in the first and second embodiments. Accordingly, the third embodiment can make the manufacturing process simpler than those of the first and second embodiments.

Each of above described MTJ structures can be introduced as MTJ elements of memory cells. Memory cells, memory cell arrays and memory devices are disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a first ferromagnetic layer having a variable magnetization direction;
   a second ferromagnetic layer having a fixed magnetization direction;
   a nonmagnetic layer provided between the first ferromagnetic layer and the second ferromagnetic layer;
   a first underlayer comprising an amorphous W;
   a second underlayer comprising a first ferromagnetic material, the first ferromagnetic material containing Co or Fe;
   a first electrode provided below the second underlayer; and
   a second electrode provided above the second ferromagnetic layer,
   wherein a thickness of the first underlayer is 8 Å or more and 20 Å or less, and the first underlayer and the second underlayer comprise amorphous portions.

2. The magnetic memory device of claim 1, wherein the first underlayer is in direct contact with the first ferromagnetic layer.

3. The magnetic memory device of claim 1, wherein the first ferromagnetic layer comprises a second ferromagnetic material, the second ferromagnetic material containing Co or Fe.

4. The magnetic memory device of claim 3, wherein the second underlayer further comprises a different material from the first ferromagnetic layer.

5. The magnetic memory device of claim 4, wherein the different material contains B, Si, S, C, P, Al, Ge, or Ga.

6. The magnetic memory device of claim 1, wherein the first ferromagnetic layer comprises a crystalline portion.

7. A magnetic memory device comprising:
   a first ferromagnetic layer having a variable magnetization direction;
   a second ferromagnetic layer having a fixed magnetization direction;
   a nonmagnetic layer provided between the first ferromagnetic layer and the second ferromagnetic layer;
   a first underlayer comprising an amorphous W;
   a second underlayer comprising a first ferromagnetic material, the first ferromagnetic material containing Co or Fe;
   a first electrode provided below the second underlayer;
   a second electrode provided above the second ferromagnetic layer; and
   a mask containing a conductive metal material,
   wherein a thickness of the first underlayer is 8 Å or more and 20 Å or less.

8. A magnetic memory device comprising:
   a first ferromagnetic layer having a variable magnetization direction;
   a second ferromagnetic layer having a fixed magnetization direction;
   a nonmagnetic layer provided between the first ferromagnetic layer and the second ferromagnetic layer;
   a first underlayer comprising an amorphous W;
   a second underlayer comprising a first ferromagnetic material, the first ferromagnetic material containing Co or Fe;
   a first electrode provided below the second underlayer;
   a second electrode provided above the second ferromagnetic layer; and
   a shift cancelling layer provided on the second ferromagnetic layer,
   wherein a thickness of the first underlayer is 8 Å or more and 20 Å or less.

9. The magnetic memory device of claim 8, further comprising an interlayer provided between the second ferromagnetic layer and the shift cancelling layer.

10. The magnetic memory device of claim 9, wherein the interlayer contains Ru.

11. A magnetic memory device comprising:
    a first ferromagnetic layer having a variable magnetization direction and comprising a crystal portion;
    a second ferromagnetic layer having a fixed magnetization direction;
    a nonmagnetic layer provided between the first ferromagnetic layer and the second ferromagnetic layer;
    a first underlayer being in direct contact with the first ferromagnetic layer and containing amorphous W;
    a second underlayer being in direct contact with the first underlayer and comprising an amorphous portion;
    a first electrode provided below the second underlayer;
    a second electrode provided above the second ferromagnetic layer; and
    a mask containing a conductive metal material, wherein the mask is provided between the second ferromagnetic layer and the second electrode.

12. The magnetic memory device of claim 11, wherein the first ferromagnetic layer is lattice matched with the nonmagnetic layer at an interface between the first ferromagnetic layer and the nonmagnetic layer.

13. The magnetic memory device of claim 12, wherein the first underlayer is not lattice matched with the first ferromagnetic layer at an interface between the first underlayer and the first ferromagnetic layer.

14. The magnetic memory device of claim 11, wherein the first ferromagnetic layer comprises a crystalline portion.

15. The magnetic memory device of claim 11, further comprising a shift cancelling layer provided on the second ferromagnetic layer.

16. The magnetic memory device of claim 15, further comprising an interlayer provided between the second ferromagnetic layer and the shift cancelling layer.

17. The magnetic memory device of claim 16, wherein the interlayer contains Ru.

18. The magnetic memory device of claim 7, wherein the mask is provided between the second ferromagnetic layer and the second electrode.

19. A magnetic memory device comprising:
    a first ferromagnetic layer having a variable magnetization direction and comprising a crystal portion;
    a second ferromagnetic layer having a fixed magnetization direction;
    a nonmagnetic layer provided between the first ferromagnetic layer and the second ferromagnetic layer;
    a first underlayer being in direct contact with the first ferromagnetic layer and containing amorphous W;

a second underlayer being in direct contact with the first underlayer and comprising an amorphous portion;
a first electrode provided below the second underlayer;
a second electrode provided above the second ferromagnetic layer; and
a shift cancelling layer provided on the second ferromagnetic layer.

20. The magnetic memory device of claim 19, further comprising an interlayer provided between the second ferromagnetic layer and the shift cancelling layer.

* * * * *